United States Patent
Kikuchi

(10) Patent No.: US 8,822,896 B2
(45) Date of Patent: Sep. 2, 2014

(54) SOLID-STATE IMAGING ELEMENT

(75) Inventor: Koji Kikuchi, Kanagawa (JP)

(73) Assignee: Sony Corporation (JP)

( * ) Notice: Subject to any disclaimer, the term of this patent is extended or adjusted under 35 U.S.C. 154(b) by 422 days.

(21) Appl. No.: 12/957,935

(22) Filed: Dec. 1, 2010

(65) Prior Publication Data

US 2011/0139966 A1    Jun. 16, 2011

(30) Foreign Application Priority Data

Dec. 11, 2009  (JP) .................................. 2009-281313

(51) Int. Cl.
*H01L 27/00*  (2006.01)
(52) U.S. Cl.
USPC ...................... 250/208.1; 250/214.1; 257/432
(58) Field of Classification Search
USPC ........ 250/208.1, 214.1, 214 R; 257/431, 432, 257/433, 436
See application file for complete search history.

(56) References Cited

U.S. PATENT DOCUMENTS

| 6,040,591 A * | 3/2000 | Otsuka .......................... 257/232 |
| 6,614,479 B1 * | 9/2003 | Fukusho et al. .............. 348/340 |
| 2005/0179103 A1 * | 8/2005 | Nakai et al. ................... 257/436 |
| 2005/0236553 A1 * | 10/2005 | Noto et al. ................. 250/208.1 |

FOREIGN PATENT DOCUMENTS

| JP | 09-148549 | 6/1997 |
| JP | 2007-095792 | 4/2007 |

* cited by examiner

*Primary Examiner* — Francis M Legasse, Jr.
(74) *Attorney, Agent, or Firm* — Sheridan Ross P.C.

(57) ABSTRACT

A solid-state imaging element includes a light-receiving element portion disposed in a semiconductor layer, an insulating layer made of a material having a refractive index $n_0$, disposed over the semiconductor layer, and an antenna structure disposed over the light-receiving element portion and surrounded by an insulating layer. The antenna structure is made of a material having a refractive index higher than the refractive index of the insulating layer. The energy of light having entered the antenna structure and the insulating layer is concentrated in the light-receiving element portion.

12 Claims, 15 Drawing Sheets

SUBPIXEL

SUBPIXEL

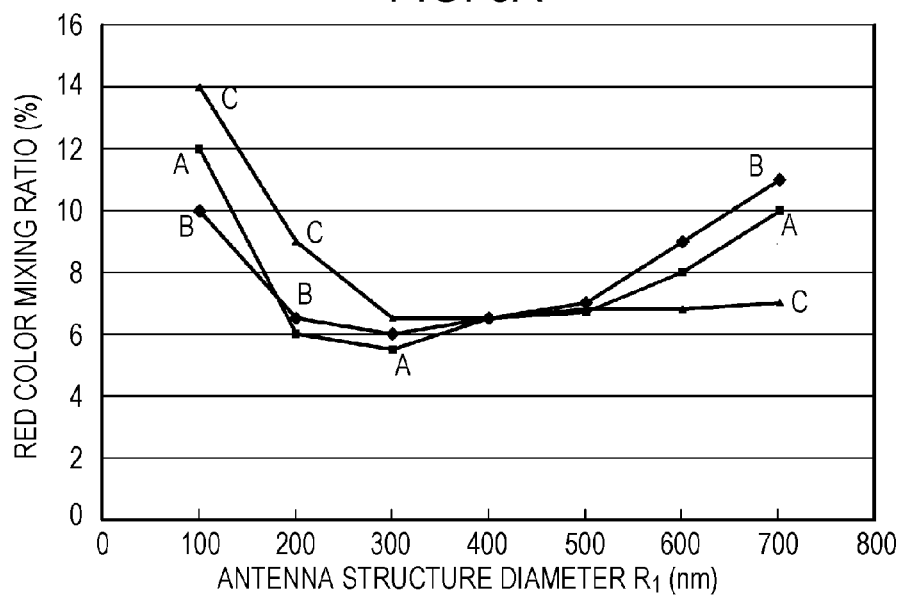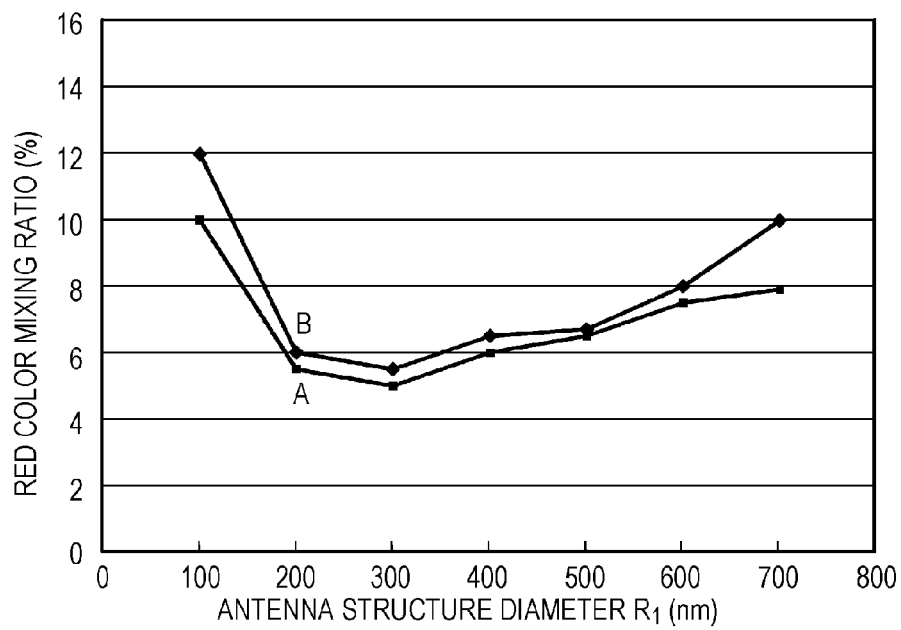

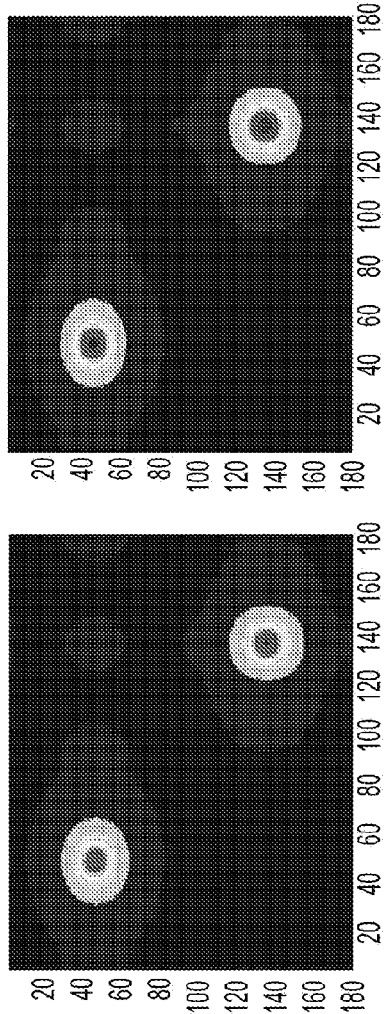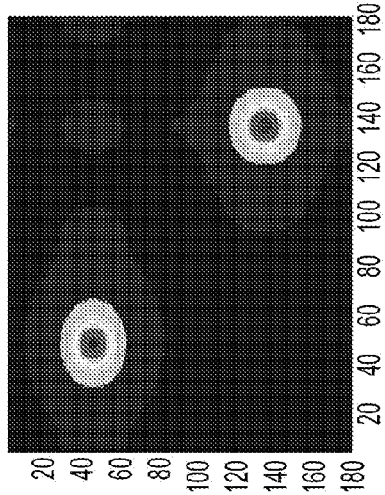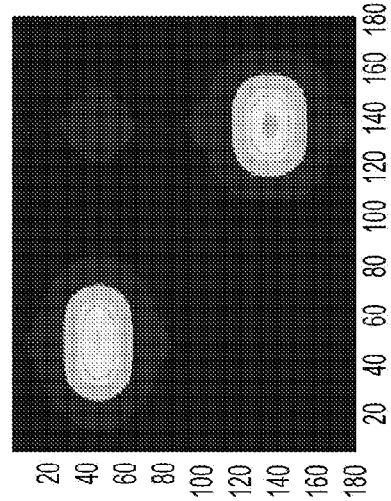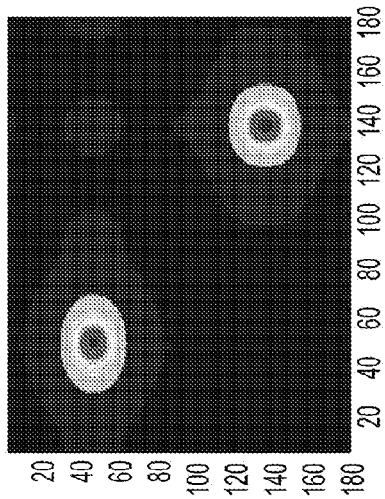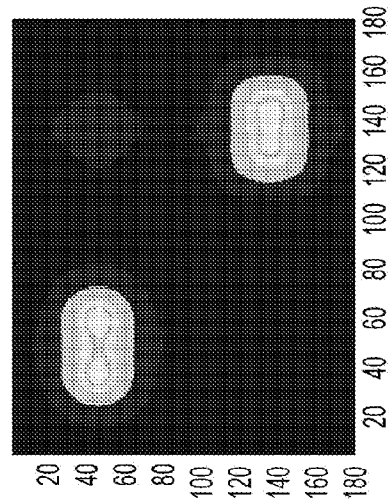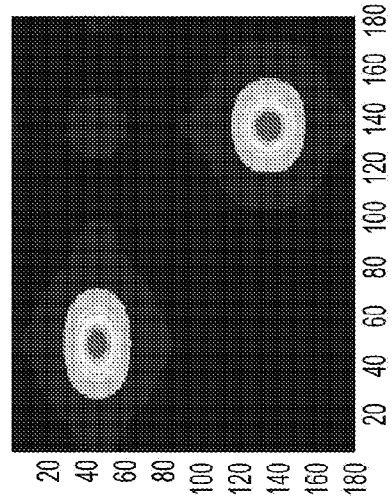

ENERGY CONCENTRATES IN PLANE
HAVING REFRACTIVE INDEX DIFFERENCE.

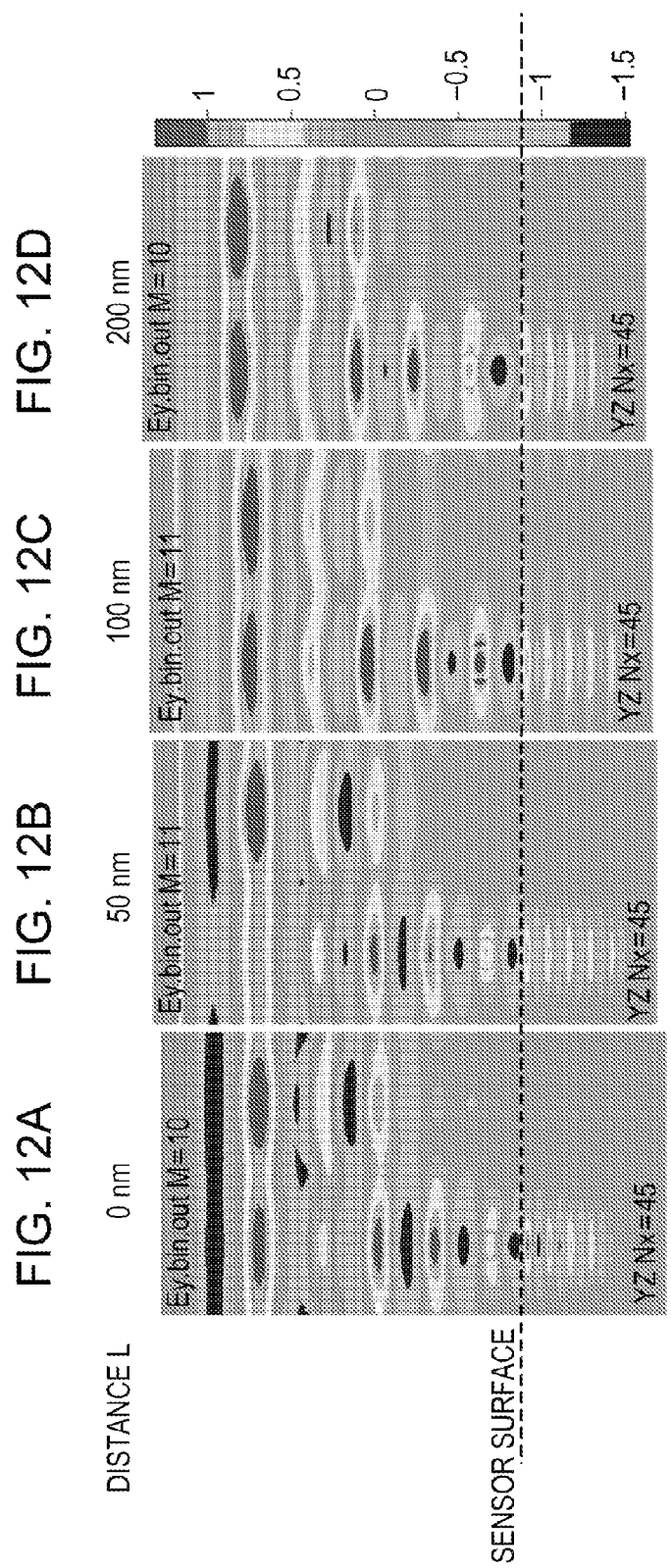

SUBPIXEL

SOLID-STATE IMAGING ELEMENT

BACKGROUND OF THE INVENTION

1. Field of the Invention

The present invention relates to a solid-state imaging element and a method for manufacturing the same.

2. Description of the Related Art

In semiconductor image sensors represented by CMOS image sensors, it is desirable that the sizes of the subpixels constituting a pixel, including a subpixel receiving red light, a subpixel receiving green light and a subpixel receiving blue light, is reduced to increase the number of pixels in an image area. However, the increase of the number of pixels reduces the size of the pixels, and reduces the size of light-receiving element portions of the subpixels accordingly. Consequently, the sensitivity of the light-receiving element portion is reduced to make it difficult to ensure a desired signal-to-nose (S/N) ratio. In addition to the reduction of the sensitivity, color mixing, which is a phenomenon in which incident light leaks to the light-receiving element portion in the adjacent subpixel, becomes pronounced.

SUMMARY OF THE INVENTION

In, for example, Japanese Unexamined Patent Application Publication No. 9-148549, the reduction of sensitivity and the color mixing are prevented by increasing the light-concentration efficiency using on-chip microlenses. However, this approach is not sufficient for subpixels of about 0.9 µm in size.

Accordingly, it is desirable to provide a solid-state imaging element that can certainly prevent the reduction of sensitivity and the occurrence of color mixing even if the size of subpixels (light-receiving element portions) is reduced, and a method for manufacturing the same.

A solid-state imaging element is provided which includes (A) a light-receiving element portion disposed in a semiconductor layer, (B) an insulating layer made of a material having a refractive index $n_0$, disposed over the semiconductor layer, and (C) an antenna structure disposed over the light-receiving element portion and surrounded by the insulating layer. The antenna structure is made of a material having a refractive index $n_1$ higher than the refractive index $n_0$ of the insulating layer. The energy of light entering the antenna structure and the insulating layer is concentrated in the light-receiving element portion.

A method is provided for manufacturing a solid-state imaging element. The method includes the steps of: (a) forming a light-receiving element portion in a semiconductor layer; (b) forming a first insulating layer over the entire surface of the semiconductor substrate; (c) forming a light-shielding layer on the first insulating layer so as to surround the light-receiving element portion; (d) selectively removing the first insulating layer using the light-shielding layer as an etching mask; (e) forming a second insulating layer in such a manner that a space surrounded by the light-shielding layer and the first insulating layer is present over the light-receiving element portion; (f) forming an antenna structure in the space by forming a dielectric material layer over the entire surface.

In the solid-state imaging element of the embodiments of the present invention, an antenna structure surrounded by an insulating layer is provided on the light-receiving element portion. The antenna structure is made of a material having a refractive index higher than that of the material of the insulating layer. Accordingly, the energy of light entering the antenna structure and the insulating layer is concentrated in the light-receiving element portion. Consequently, the sensitivity and the occurrence of color mixing can be certainly prevented even if the size of the light-receiving element portion is reduced. The structure disposed on the light-receiving element portion is called an antenna structure because it concentrates light energy in the light-receiving element portion. In the method for manufacturing the solid-state imaging element, the presence of the light-shielding layer allows the antenna structure surrounded by the insulating layer (second insulating layer) to be formed in a self-aligned manner. This can enhance the accuracy in positioning when the insulating layer (second insulating layer) and the antenna structure are formed.

BRIEF DESCRIPTION OF THE DRAWINGS

FIG. 3A is a plot of the results of measurements for the red color mixing ratio of solid-state imaging elements according to a second embodiment, including disc-like antenna structures having different diameters and heights, and FIG. 3B is a plot similar to FIG. 3A of solid-state imaging elements according to a third embodiment, including disc-like antenna structures having different diameters;

FIGS. 4A to 4F are representations of the simulation results of light energy propagation in solid-state imaging elements according to a second embodiment, including disc-like antenna structures having different diameters;

FIGS. 12A to 12D are representations of the simulation results of light energy propagation in solid-state imaging elements according to the seventh embodiment when light having a wavelength of 540 nm enters a microlens, passes through a color filter and an insulating interlayer, and further passes through an antenna structure;

DESCRIPTION OF THE PREFERRED EMBODIMENTS

Figure 1A:
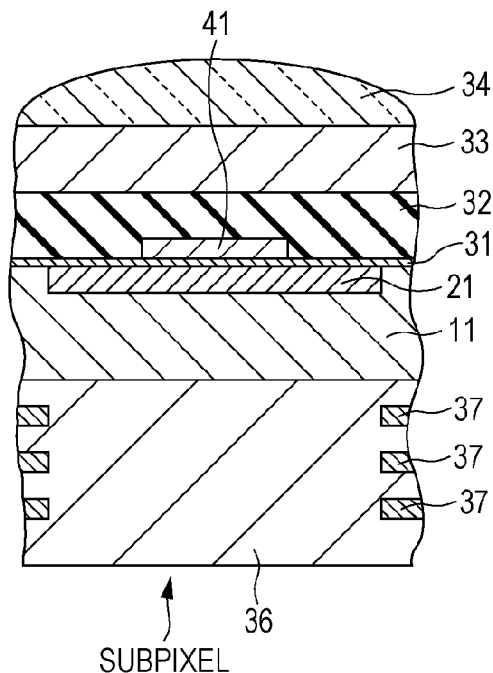
FIGS. 1A and 1B are fragmentary sectional views of solid-state imaging elements according to a first embodiment and a third embodiment, respectively.

Embodiments of the present invention will be described with reference to the drawings. However, the invention is not limited to the embodiments disclosed below, and the values and materials used in the embodiments are merely examples. The description will be made in the following order:
1. General description of the solid-state imaging element of the present invention.
2. First embodiment (solid-state imaging element)
3. Second embodiment (modification of the first embodiment)
4. Third embodiment (another modification of the first embodiment)
5. Fourth embodiment (modification of the third embodiment)
6. Fifth embodiment (another modification of the third embodiment)
7. Sixth embodiment (another modification of the first embodiment)
8. Seventh embodiment (another modification of the first embodiment)
9. Eighth embodiment (another embodiment of the first embodiment and miscellaneous description)

General description of Solid-state imaging element and method for manufacturing the same In a solid-sate imaging element according to an embodiment of the present invention or a solid-state imaging element manufactured by a method according to an embodiment of the invention (both can be referred to as the solid-state imaging element according to an embodiment of the invention), it is preferable that the projection of an antenna structure projected in a direction in which light enters the antenna structure is within the light-receiving element portion, from the viewpoint of ensuring the concentration of the energy of light that has passed through the antenna structure and an insulating layer. Preferably, the antenna structure is positioned with respect to the light-receiving element portion so that light passing through the center of the antenna structure enters the center of the light-receiving element portion. The normal to the antenna structure passing through the center of the antenna structure does not necessarily pass through the center of the light-receiving element portion. In other words, the positional relationship between the light-receiving element portion and the antenna structure may be changed depending on the position of the light-receiving element portions of a solid-state imaging device including a plurality of light-receiving element portions. The planar shape and size of the antenna structure may be changed depending on the position of the light-receiving element portions of the solid-state imaging device.

Preferably, the antenna structure is in a cylindrical (or disc-like) shape having a diameter of 0.2 to 0.4 μm, preferably 0.2 to 0.3 μm. Alternatively, the antenna structure may be in a columnar shape (for example, in a shape of cylinder or polygonal column), and the section of the antenna structure taken in the direction perpendicular to the height has an area of $1\times10^{-14}$ to $4\times10^{-14}$ πm². The height of the antenna structure may be 0.1 to 0.8 μm, and preferably 0.2 to 0.5 μm.

A solid-state imaging element according to an embodiment of the present invention may further include an insulating interlayer over the antenna structure, a color filter on the insulating interlayer, and a microlens on the color filter.

In a solid-state imaging element according to an embodiment of the invention, the antenna structure has an extension extending from the top thereof in the direction parallel to the surface of the semiconductor layer.

In a solid-state imaging element according to an embodiment of the invention, the insulating layer (or second insulating layer) may be made of a material having a refractive index $n_0$, and the antenna structure may be made of a material having a refractive index $n_1$. Preferably, the difference in refractive index $(n_1-n_0)$ is 0.25 or more. In this instance, the material of the antenna structure may be selected from the group consisting of silicon nitride (SiN), silicon oxynitride (SiON), hafnium oxide ($HfO_x$), and tantalum oxide ($Ta_2O_5$), or may be a transparent dielectric material in which fine particles are dispersed, such as siloxane in which $TiO_x$ fine particles are dispersed. For example, the $TiO_x$ particles may have a particle size of $1\times10^{-8}$ to $3\times10^{-8}$ m. By varying the $TiO_x$ particle content, the refractive index of the $TiO_x$-dispersed siloxane can be controlled. Examples of the material of the insulating layer (including the first and the second insulating layer described below) include $SiO_x$ materials (materials forming silicon oxide films) such as $SiO_2$, NSG (non-doped silicate glass), BPSG (boron phosphorus silicate glass), PSG (phosphoro-silicate glass), BSG (borosilicate glass), AsSG (arsenic silicate glass), SbSG (antimony silicate glass) and SOG (spin-on-glass), SiN, SiON, SiOF, SiC, SiOC, SiCN, insulating materials having low dielectric constants such as organic SOG having a dielectric constant k $(=\epsilon/\epsilon_0)$ of, for example, 3.5 or less, polyimide resins, and fluorocarbon resins (for example, fluorocarbon, amorphous tetrafluoroethylene, polytetrafluoroethylene, fluorinated aryl ether, fluorinated polyimide, parylene, benzocyclobutene, amorphous carbon, cycloperfluorocarbon polymer, cyclic fluorocarbon polymer, fluorinated fullerene), and polyallyl ethers (PAEs) such as Silk (trade name of the Dow Chemical Co., insulating interlayer material having a low dielectric constant) and Flare (trade name of Honeywell Electronic Materials Co.).

Preferably, the top of the antenna structure has a flat surface.

Preferably, the distance L between the surface of the semiconductor layer and the bottom of the antenna structure is 0.2 μm or less.

Preferably, an antireflection film is formed on the surface of the semiconductor layer. The antireflection film can be formed of $HfO_x$, $Ta_2O_5$, SiON, SiN, or the like. The antireflection film may be composed of a single layer or a plurality of layers. In this instance, the antenna structure is disposed on the antireflection film, or over the antireflection film with an insulating layer or a second insulating layer therebetween.

In a solid-state imaging element of an embodiment of the invention, a light-shielding layer may be provided around the antenna structure with the insulating layer (or second insulating layer) therebetween. More specifically, the antenna structure may be surrounded by a ring-shaped light-shielding layer in such a manner that they are separated by the insulating layer (or second insulating layer). Exemplary materials of the light-shielding layer include tungsten (W), copper (Cu), aluminum (Al), and ruthenium (Ru).

In a solid-state imaging element according to an embodiment of the invention, a drive circuit driving the light-receiving element portion may be provided on the side of the semiconductor layer opposite to the antenna structure. This solid-state imaging element is of rear emission type. However, a solid-state imaging device according to another embodiment may be of front emission type without being limited to the rear emission type. The drive circuit can have a known configuration.

In manufacture of the solid-state imaging element according to an embodiment of the invention, a dielectric material layer may be formed by coating in Step (f). In this instance, Step (f) forming the dielectric material layer may be performed by applying a solution of siloxane containing $TiO_x$ particles, followed by drying. The coating may be performed by spin coating.

In an embodiment of the invention, the semiconductor layer may be made of Si. Specifically, the semiconductor layer may be a silicon semiconductor substrate, may be formed on a semiconductor substrate by epitaxial growth, or may be a silicon layer having a so-called SOI (silicon-on-insulator) structure. Alternatively, the semiconductor layer may be made of at least one material selected from the group consisting of Ge, SiGe, GaAs, GaP, InGaP, and InP. The light-receiving element portion has a known CCD or CMOS image sensor structure. The color filter and the microlense can have known structures.

A set of the solid-state imaging elements can constitute a single-plate solid-state color imaging device, such as a CCD image sensor or a CMOS image sensor. The solid-state imaging elements may be arranged in various manners include a Bayer array, an interline array, a G-striped RB-checked array, a G-striped RB-fully checked array, a complementary color checked array, a striped array, an obliquely striped pattern, a primary color differential array, a field color sequential differential array, frame color sequential differential array, a MOS-type arrangement, a modified MOS-type arrangement, a frame interleave array, and a field interleave array.

First Embodiment

In a first embodiment, a solid-state imaging element will be described. FIG. 1A is a schematic fragmentary sectional view of a solid-state imaging element according to the first embodiment. The solid-state imaging element is of rear emission type, and includes (A) a light-receiving element portion 21 formed in a semiconductor layer 11, (B) an insulating layer 32 disposed over the semiconductor layer 11, and (C) an antenna structure 41 disposed over the light-receiving element portion 21 and enclosed in the insulating layer 32.

In the solid-state imaging element of the present embodiment, an insulating interlayer (not shown) is formed over the antenna structure 41 and the insulating layer 32. Although the insulating interlayer is not necessarily provided, it is preferably provided from the viewpoint of enhancing the adhesion of a color filter. The color filter (on-chip color filter) 33 is formed on the insulating interlayer, and a microlens (on-chip microlens) 34 is disposed on the color filter 33. The insulating interlayer integrally continues from the insulating layer 32. In the following description, the insulating interlayer and the insulating layer 32 may be together referred to as the insulating layer 32 in some cases.

The antenna structure 41 is made of a dielectric material having a refractive index $n_1$ higher than the refractive index $n_0$ of the material of the insulating layer 32, so that the energy of light having entered the antenna structure 41 and the insulating layer 32 can be concentrated in the light-receiving element portion 21. More specifically, the antenna structure 41 is disposed between the light-receiving element portion 21 in the semiconductor layer 11 and the insulating layer 32 so as to be enclosed in the insulating layer 32. The projection of the antenna structure 41 projected in a direction in which light enters the antenna structure 41 is within the light-receiving element portion 21.

Specifically, the antenna structure 41 has a cylindrical (disc-like) shape having a diameter $R_1$ of 0.3 μm and a higher $H_1$ of 0.2 μm. The antenna structure is positioned with respect to the light-receiving element portion 21 so that light passing through the center of the antenna structure 41 enters the center of the light-receiving element portion 21. A 64 nm thick $HfO_x$ antireflection film 31 is formed on the surface of the semiconductor layer 11, and the antenna structure 41 is disposed on the antireflection film 31. The distance L between the surface of the semiconductor layer 11 and the bottom of the antenna structure 41 is 0.2 μm or less. The difference in refractive index between the antenna structure 41 and the insulating layer 32 ($n_1-n_0$) is 0.25 or more. In the present embodiment, the insulating layer 32 can be made of $SiO_2$ having a refractive index $n_0$ of 1.46. The insulating layer 32 on the antireflection film 31 has a thickness of 0.3 μm. The antenna structure 41 can be made of SiONa having a refractive index $n_1$ of 1.9. As described above, the antenna structure 41 is in a cylindrical (disc-like) shape having a flat top and a smooth, curved periphery.

The semiconductor layer 11 is made of a silicon semiconductor substrate, and the light-receiving element portion 21 has a known CMOS image sensor structure. The light-receiving element portion 21 is abstractly shown in the drawings. A subpixel including the light-receiving element portion 21 measures 0.9 μm by 0.9 μm. In the solid-state imaging elements, the subpixels are arranged in a Beyer array. A single-plate solid-state color imaging device including CMOS image sensors is defined by a set of the solid-state imaging elements. In addition, a drive circuit (not shown) driving the light-receiving element portion 21 is disposed on the side of the semiconductor layer 11 opposite to the antenna structure 41. This side of the semiconductor layer 11 is covered with a planarizing layer 36 in which wirings 37 are formed. In the present embodiment, the drive circuit is a type of MOS switch including a transfer gate. The color filter 33 has a thickness of 0.43 μm. The entire microlens 34 has a thickness of 0.75 μm, and lens portion of the microlens has a thickness of 0.3 μm. The light-receiving element portion 21, the color filter 33, the microlens 34, the drive circuit, the wirings and other members may have known structures.

Solid-state image elements were prepared: one had the same structure as the first embodiment (Example); the other had the same structure as the first embodiment except that the antenna structure was not formed (Comparative Example).

Figure 2A:
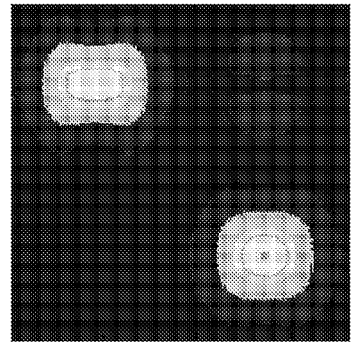
FIGS. 2A to 2C are representations of simulation results of light energy propagation in a solid-state imaging element of a comparative example.
Figure 2D:
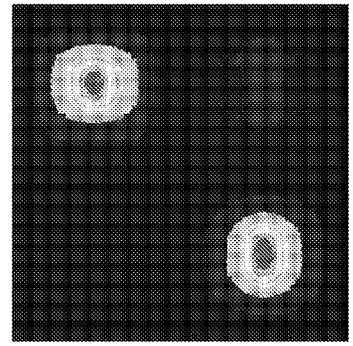
FIGS. 2D to 2F are representations of simulation results of light energy propagation in a solid-state imaging element according to a first embodiment.
Figure 2B:
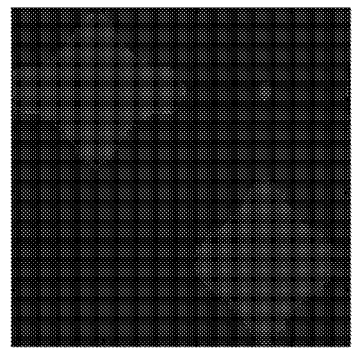
Figure 2E:
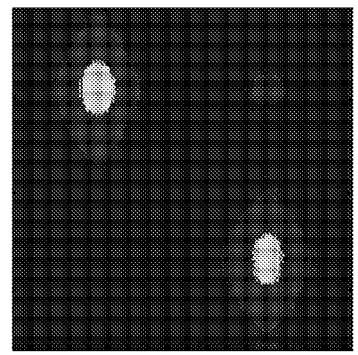
Figure 2C:
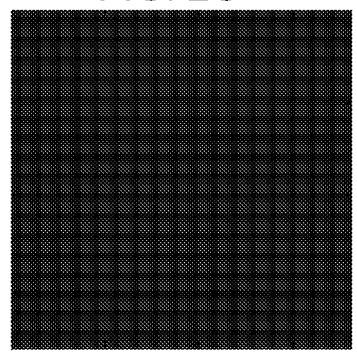
Figure 2F:
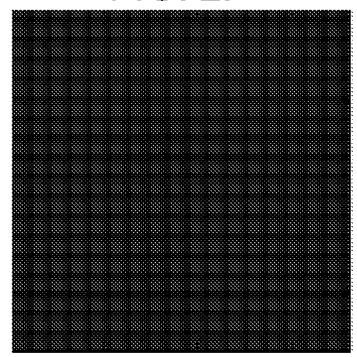

FIGS. 2D, 2E, and 2F show the simulation results of light energy propagation in the solid-state imaging element of the Example when light having a wavelength of 540 nm has entered the microlens 34 and has passed through the color filter 33, the insulating layer 32 and the antenna structure 41. FIGS. 2A, 2B, and 2C show the simulation results of light energy propagation in the solid-state imaging element of the Comparative Example when light having a wavelength of 540 nm has entered the microlens 34 and has passed through the color filter 33 and the insulating layer 32. The images of FIGS. 2A to 2F each measure 1.8 μm by 1.8 μm. The solid-state imaging elements were arranged in a Beyer array. Subpixels receiving green light were disposed at the upper left and the lower right in the image; a subpixel receiving red light was disposed at the upper right in the image; and a subpixel receiving blue light was disposed at the lower left in the image.

FIGS. 2A and 2D show the state of the interface between the insulating layer 32 or the antenna structure 41 and the antireflection film 31; FIGS. 2B and 2E show the state at a depth of 1.5 μm from the surface of the semiconductor layer 1; and FIGS. 2C and 2F show the state at a depth of 3.0 μm from the surface of the semiconductor layer 11. In FIGS. 2A to 2F, the brighter the regions, the higher the light energy. The same applies in FIGS. 4A to 4F and 15A and 15B.

In comparison of FIGS. 2D to 2F to FIGS. 2A to 2C, the solid-state imaging element of the Example shows that the spread of light energy at the interface between the antenna structure 41 and the antireflection film 31 is smaller than that in the Comparative Example (see FIGS. 2A and 2D), and that the light energy reaches a smaller area inside the semiconductor layer 11 (see FIGS. 2B and 2E). This suggests that the presence of the antenna structure 41 allows light energy to propagate through the center region of the light-receiving element portion.

The red and blue color mixing ratios were measured of light having a wavelength of 540 nm having entered a pixel including a subpixel receiving green light, a subpixel receiving red light and a subpixel receiving blue light. The red color mixing ratio refers to a percentage of the amount of light received by the red light-receiving subpixel to the amount of light received by the green light-receiving subpixel, and the blue color mixing ratio refers to a ratio of the amount of light received by the blue light-receiving subpixel to the amount of light received by the green light-receiving subpixel. The results are shown in Table 1. As is clear from Table 1, in the solid-state imaging element of the Example having the antenna structure 41, light of 540 nm having entered the green light-receiving subpixel leaked less to the adjacent red and blue light-receiving subpixel; hence, the occurrence of color mixing was reduced in comparison with the solid-state imaging element of the Comparative Example.

TABLE

|  | Example | Comparative Example |
|---|---|---|
| Red color mixing ratio | 5% | 9% |
| Blue color mixing ratio | 19% | 26% |

The presence of the antenna structure 41 ensures the concentration of light energy in the light-receiving element portion 21, and prevents the reduction of sensitivity even if the size of the light-receiving element portion 21 is reduced. Furthermore, color mixing can be certainly prevented in the light-receiving element portions 21 of the adjacent subpixels.

Figure 15A:
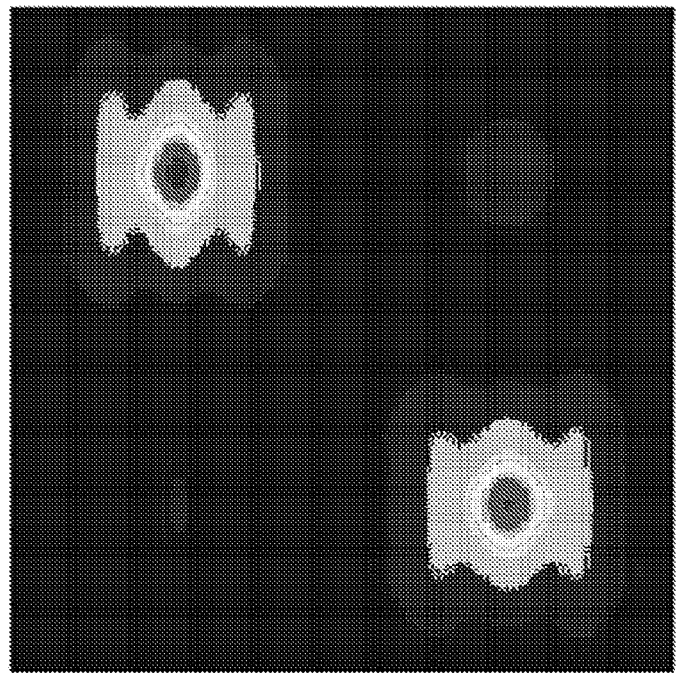
FIGS. 15A and 15B are representations of the simulation results of light energy propagation in solid-state imaging elements for comparison.
Figure 15B:
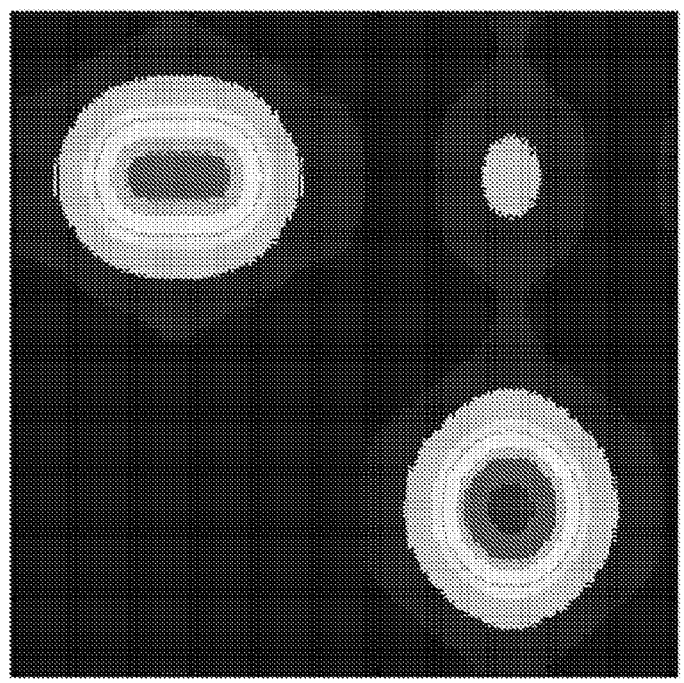

For reference, FIG. 15A shows the simulation result of light energy propagation in a solid-state imaging element not having the antenna structure whose subpixel measured 1.75 μm by 1.75 μm, and FIG. 15B shows the simulation result of light energy propagation in a solid-state imaging element not having the antenna structure whose subpixel measured 0.9 μm by 0.9 μm. The image shown in FIG. 15A measures 3.5 μm by 3.5 μm, and the image shown in FIG. 15B measures 1.8 μm by 1.8 μm. The solid-state imaging elements were arranged in a Beyer array in such a manner that the subpixels receiving green light were disposed at the upper left and the lower right in the image, the subpixel receiving red light was disposed at the upper right in the image, and the subpixel receiving blue light was disposed at the lower left in the image. FIGS. 15A and 15B show that if the size of the subpixels is reduced, light energy becomes liable to leak to the adjacent subpixels due to the degradation of microlens effect.

For example, Japanese Unexamined Patent Application Publication No. 2007-095792 discloses a solid-state imaging element including an optical waveguide structure over a light-receiving element portion. In this disclosure, the optical waveguide structure is intended to prevent the loss of light entering the light-receiving element portion, and light is totally reflected within the optical waveguide structure. On the other hand, the solid-state imaging element of embodiments of the invention does not have an optical waveguide structure and is totally different from the solid-state imaging element disclosed in Japanese Unexamined Patent Application Publication No. 2007-095792. In the solid-state imaging element of embodiments of the invention, the side surface of the antenna structure 41 and the insulating layer 32 have a difference $\Delta n$ ($=n_1-n_0$) in refractive index at their boundary. Accordingly, the electric field vector of light in the direction of the normal to the boundary is amplified to increase the optical intensity, and the amplified light energy reaches under the boundary or into the light-receiving element portion close to the boundary. Since the top of the antenna structure 41 has a flat surface, the antenna structure 41 does not have the lens effect of concentrating or diffusing light.

The solid-state imaging element of the first embodiment can be manufactured by the following method.

Step 100

First, a drive circuit, a peripheral circuit, a planarizing layer 36, wirings 37 and so forth are formed at the front side of a silicon semiconductor substrate by a known process. Subsequently, the thickness of the silicon semiconductor substrate is reduced by etching or grinding the rear side of the silicon semiconductor substrate. Then, a light-receiving element portion 21 is formed in the rear side of the silicon semiconductor substrate (corresponding to the semiconductor layer 11) by a known method.

Step 110

Subsequently, an antireflection film 31 is formed on the rear side of the silicon semiconductor substrate (surface of the semiconductor layer 11) by sputtering.

Step 120

Then, a dielectric material layer for the antenna structure 41 is formed over the entire surface of the antireflection film by CVD. The dielectric material layer is patterned into a disc-like antenna structure 41 by lithography and etching.

Step 130

An insulating layer 32 is formed over the entire surface of the substrate by CVD, and is then planarized. Thus, the insulating layer is formed to enclose the antenna structure 41, and, at the same time, an insulating interlayer is formed over the antenna structure 41 and the insulating layer 31. Then, a color filter 33 and a microlens 34 are formed on the insulating interlayer (insulating layer 32) by a known method. Thus, a solid-state imaging element according to the first embodiment is completed.

Second Embodiment

In a second embodiment, the solid-state imaging element of the first embodiment is modified. For the second embodiment, the red color mixing ratios were measured of solid-state imaging elements including the disc-like antenna structures 41 having different diameters $R_1$ and heights $H_1$. The results are shown in FIG. 3A. In FIG. 3A, data A indicated by black squares represents the results of samples each including the antenna structure having a height $H_1$ of 0.2 µm; data B indicated by black rhombuses represents the results of samples each including the antenna structure having a height $H_1$ of 0.1 µm; and data C indicated by black triangles represents the results of samples each including the antenna structure having a height $H_1$ of 0.5 µm. As shown in FIG. 3A, the antenna structure 41 can have a diameter $R_1$ of 0.2 to 0.4 µm, more preferably 0.2 to 0.3 µm. Preferably, the antenna structure 41 is in a columnar shape, and its section taken in the direction perpendicular to the height has an area of $1 \times 10^{-14}$ to $4 \times 10^{-14}$ πm². Examples of the cylindrical shape include cylinders and columns of polygons (for example, whose base has six sides or more, such as a regular hexagonal column, a regular octagonal column, and regular decagonal column). Preferably, the height $H_1$ is 0.2 µm or less. When incident light has a wavelength λ of 540 nm, the wavelength of light in the antenna structure 41 is $\lambda/n_1 = 540/1.9 = 284$ (nm), and the preferred diameter $R_1$ of the antenna structure 41 is approximately equal to the value of $\lambda/n_1$.

Figure 5:
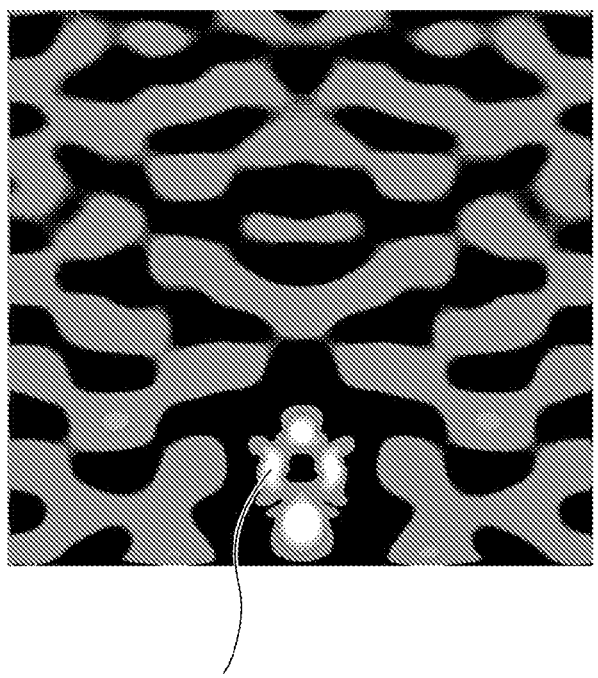
FIG. 5 is a representation of the simulation result of propagation in a disc-like antenna structure of a solid-state imaging element according to the second embodiment.

FIGS. 4A to 4F are representations of the simulation results of light energy propagation in solid-state imaging elements according to the second embodiment, including the disc-like antenna structures having different diameters $R_1$. FIG. 4A shows the result when the diameter $R_1$ is 200 nm; FIG. 4B shows the result when the diameter $R_1$ is 250 nm; FIG. 4C shows the result when the diameter $R_1$ is 300 nm; FIG. 4D shows the result when the diameter $R_1$ is 350 nm; FIG. 4E shows the result when the diameter $R_1$ is 400 nm; and FIG. 4F shows the result when the diameter $R_1$ is 450 nm. These results suggest that the antenna structure 41 can have a diameter $R_1$ of 0.2 to 0.4 µm, more preferably 0.2 to 0.3 µm. In addition, energy propagation of light having a wavelength λ of 540 nm at incidence was simulated under the condition where the antenna structure 41 had a diameter $R_1$ of 500 nm. The result is shown in FIG. 5. As shown in FIG. 5, light energy is concentrated at a plane having a difference in refractive index (specifically, at the interface between the side surface of the antenna structure 41 and the insulating layer 32).

Third Embodiment

Figure 1B:
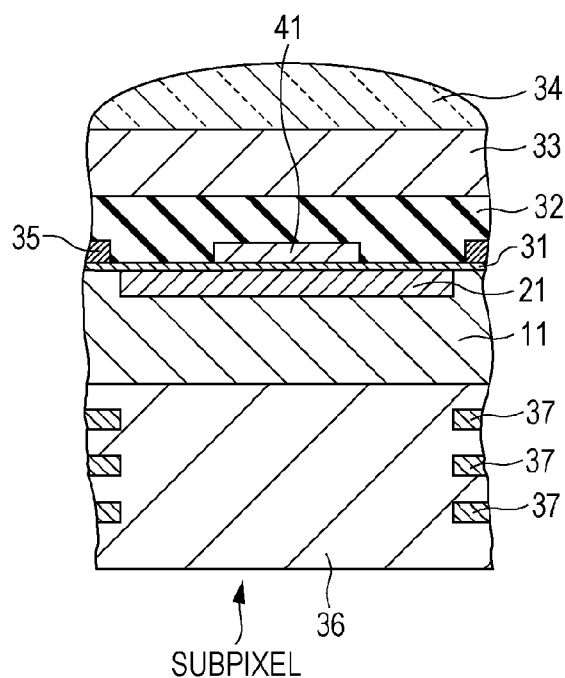

In a third embodiment, the solid-state imaging element of the first embodiment is modified. In the third embodiment, a tungsten (W) light-shielding layer 35 is provided around the antenna structure 41 with the insulating layer 32 therebetween, as shown in the schematic fragmentary sectional view of FIG. 1B. More specifically, the antenna structure 41 is surrounded by a ring-shaped light-shielding layer 35 in such a manner that they are separated by the insulating layer 32. Samples of the solid-state imaging element according to the third embodiment were prepared. In the samples, the ring-shaped light-shielding layer 35 had a height of 0.2 µm and a width (thickness) of 0.2 µm, and the distance between the side surface of the antenna structure 41 and the side surface of the light-shielding layer 35 was 0.15 µm. The antenna structure 41 had a height $H_1$ of 0.2 µm. The red color mixing ratios were measured of the samples including disc-like antenna structures 41 having different diameters $R_1$. The results are shown in FIG. 3B. The red color mixing ratio of the solid-state imaging element having the same structure as the first embodiment is also shown together in FIG. 3B. In FIG. 3B, data A indicated by black squares represents the results of the solid-state imaging elements according to the third embodiment, and data B indicated by black rhombuses represents the results of solid-state imaging elements having the same structure as the first embodiment. FIG. 3B shows that the presence of the light-shielding layer 35 reduces the light energy leaking to the adjacent subpixels, and thus ensures the prevention of color mixing.

Fourth Embodiment

In a fourth embodiment, a solid-state imaging element of a modification of the third embodiment is manufactured. A method for manufacturing a solid-state imaging element according to the fourth embodiment will now be described with reference to the schematic fragmentary sectional views of FIGS. 6A and 6B, 7A and 7B, and 8A and 8B.

Step 400

First, a light-receiving element portion 21 is formed in a semiconductor layer 11. More specifically, a drive circuit, a peripheral circuit, a planarizing layer 36, wirings 37 and so forth are formed at the front side of a silicon semiconductor substrate by a known process, in the same manner as in Step 100 of the first embodiment. Subsequently, the thickness of the silicon semiconductor substrate is reduced by etching or grinding the rear side of the silicon semiconductor substrate. Then, a light-receiving element portion 21 is formed in the rear side of the silicon semiconductor substrate (corresponding to the semiconductor layer 11) by a known method. Subsequently, an antireflection film 31 is formed on the rear side of the silicon semiconductor substrate (surface of the semiconductor layer 11) by sputtering.

Step 410

Figure 6A:
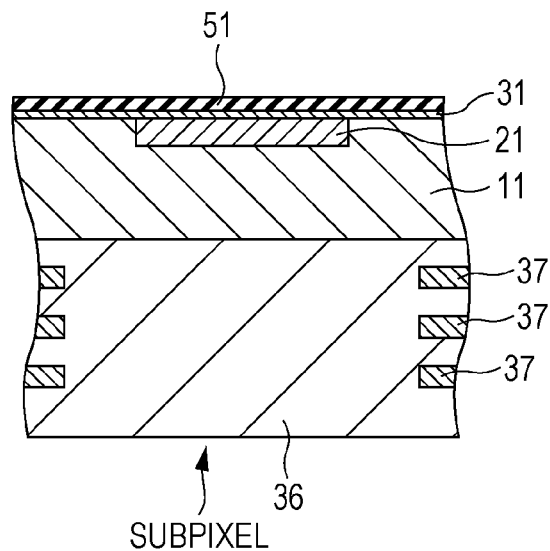
FIGS. 6A and 6B are schematic fragmentary sectional views showing a method for manufacturing a solid-state imaging element according to a fourth embodiment of the present invention.
Figure 6B:
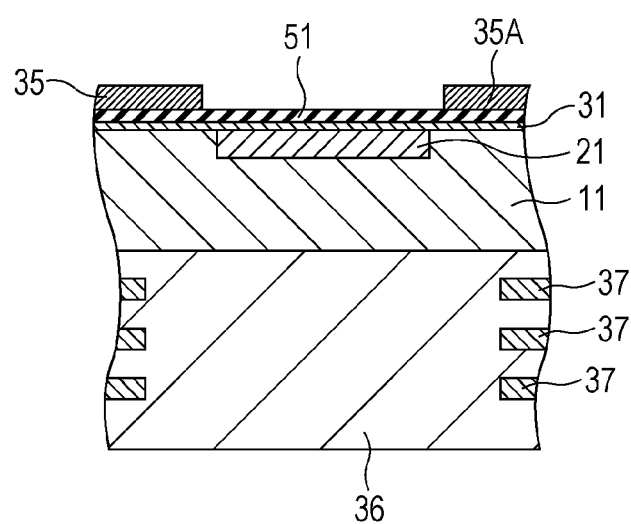

A $SiO_2$ first insulating layer 51 is formed over the entire surface by CVD, as shown in FIG. 6A.

Step 420

A light-shielding layer 35 is formed on the first insulating layer 51 so as to surround the light-receiving element portion 21. More specifically, a tungsten (W) layer 35A is formed to a thickness of 0.2 µm on the first insulating layer 51 by CVD. Then, the tungsten layer 35A is dry-etched into a light-shielding layer 35 through an etching mask formed by photolithography. The etching mask is removed to return to the state shown in FIG. 6B.

Step 430

Figure 7A:
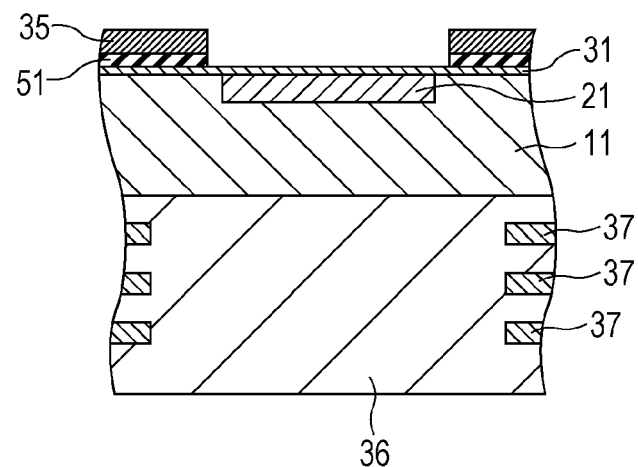
FIGS. 7A and 7B are schematic fragmentary sectional views subsequent to FIG. 6B, showing the method for manufacturing the solid-state imaging element according to the fourth embodiment.

Subsequently, the first insulating layer 51 is selectively dry-etched using the light-shielding layer 35 as an etching mask, as shown in FIG. 7A. The first insulating layer 51 remains under the light-shielding layer 35.

Step 440

Figure 7B:
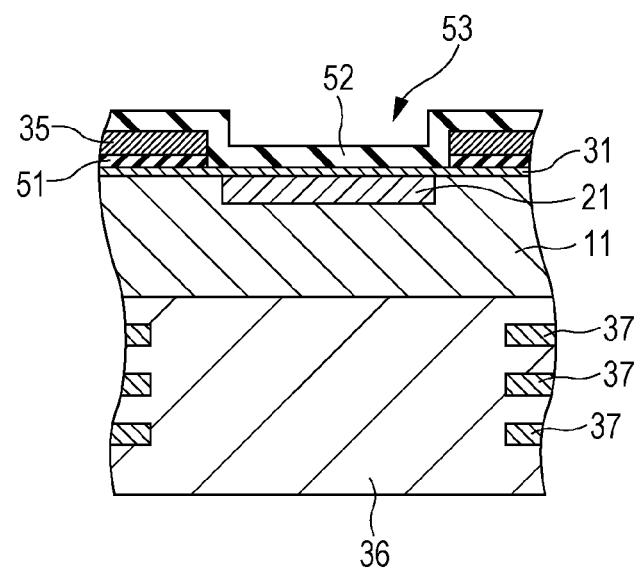

A second insulating layer 52 is formed over the entire surface in such a manner that a space 53 surrounded by the light-shielding layer 35 and the first insulating layer 51 is present over the light-receiving element portion 21. More specifically, the second insulating layer 52 is conformally formed of $SiO_2$ to a thickness of, for example, 0.15 µm over the entire surface by CVD, as shown in FIG. 7B.

Step 450

Figure 8A:
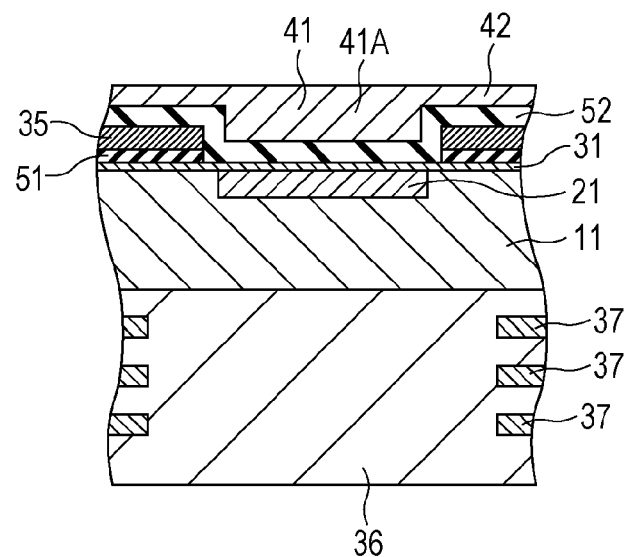
FIGS. 8A and 8B are schematic fragmentary sectional views subsequent to FIG. 7B, showing the method for manufacturing the solid-state imaging element according to the fourth embodiment.

Subsequently, a dielectric material layer 41A is formed over the entire surface to form an antenna structure 41 in the space 53, as shown in FIG. 8A. More specifically, a siloxane solution in which $TiO_x$ fine particles are dispersed is prepared. The $TiO_x$ particle content is, for example, 40% by weight. The solution is applied by coating, such as spin coating, and is then dried (heated) to form the antenna structure 41. The antenna structure 41 may or may not be patterned. If the antenna structure 41 is not patterned, an extension 42 extends from the antenna structure 41.

Step 460

Figure 8B:
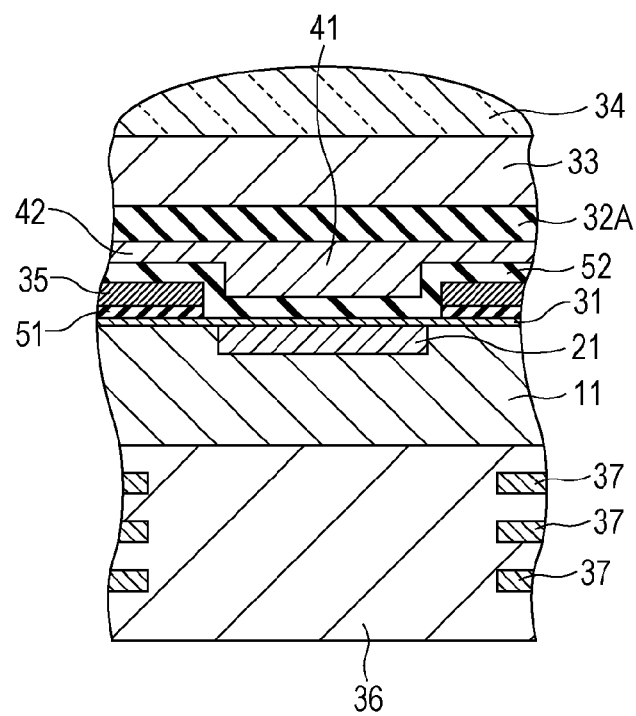

Then, a $SiO_2$ insulating interlayer 32A is formed over the entire surface by CVD, and is subsequently planarized. Thus, the insulating layer (second insulating layer 52) is formed in such a manner as to surround the antenna structure 41, and the insulating interlayer 32A is formed over the antenna structure 41 and the insulating layer (second insulating layer 52). Then, a color filter 33 and a microlens 34 are formed on the insulating interlayer 32A by a known method. Thus, a solid-state imaging element according to the fourth embodiment is completed, as shown in FIG. 8B.

In the method of the fourth embodiment, the light-shielding layer 35 is formed. This allows the second insulating layer 52 and the antenna structure 41 to be formed in a self-aligned manner. Thus, precise alignment of the second insulating layer 52 and the antenna structure 41 can be easily achieved. In the method of the first embodiment, when the dielectric material layer is patterned into the antenna structure 41 by etching in Step 120, the semiconductor layer and other members may be damaged, and consequently, the dark current, which is an output of noises during not receiving light, may be increased. On the other hand, for forming the antenna structure in the fourth embodiment, merely an opening is formed in the portion of the first insulating layer 51 over the light-receiving element portion 21 in Step 430. Thus, the region that can be damaged is limited to the light-receiving element portion, and consequently the dark current can be reduced. Accordingly, the manufacturing process of the solid-state imaging element can be flexibly designed. In Step 450 of the method of the fourth embodiment, the dielectric material layer for the antenna structure 41 may be formed over the surface by CVD, as in the first embodiment.

Fifth Embodiment

In a fifth embodiment, a solid-state imaging element according to the third embodiment is manufactured by a modification of the method of the first embodiment. A method according to the fifth embodiment will now be described with reference to the schematic fragmentary sectional views of FIGS. 9A and 9B and 10A and 10B.

Step 500

First, a light-receiving element portion is formed in a semiconductor layer and an antireflection film 31 is further formed, in the same manner as in Step 400 of the fourth embodiment.

Step 510

Subsequently, a SiO$_2$ first insulating layer 61 is formed over the entire surface by CVD.

Step 520

A light-shielding layer 35 is formed on the first insulating layer 61 so as to surround the light-receiving element portion 21. More specifically, a tungsten (W) layer 35A is formed to a thickness of 0.2 μm on the first insulating layer 61 by CVD. Then, the tungsten layer 35A is dry-etched into a light-shielding layer 35 through an etching mask formed by photolithography. The etching mask is removed to return to the state shown in FIG. 9A.

Step 530

Figure 9A:
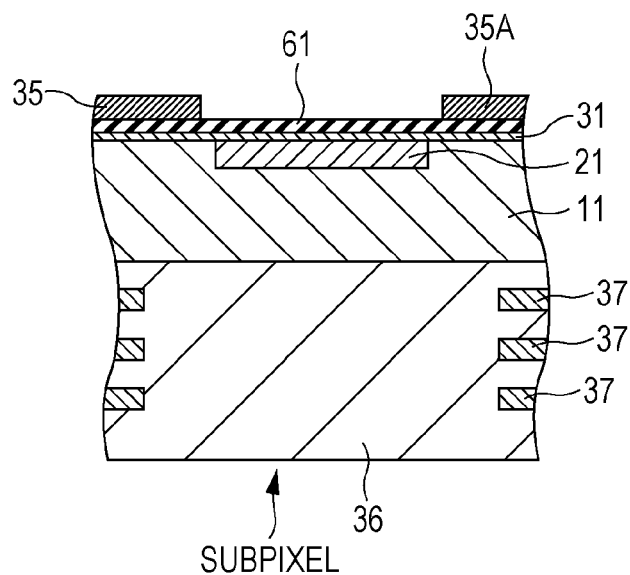
FIGS. 9A and 9B are schematic fragmentary sectional views showing a method for manufacturing a solid-state imaging element according to a fifth embodiment of the present invention.
Figure 9B:
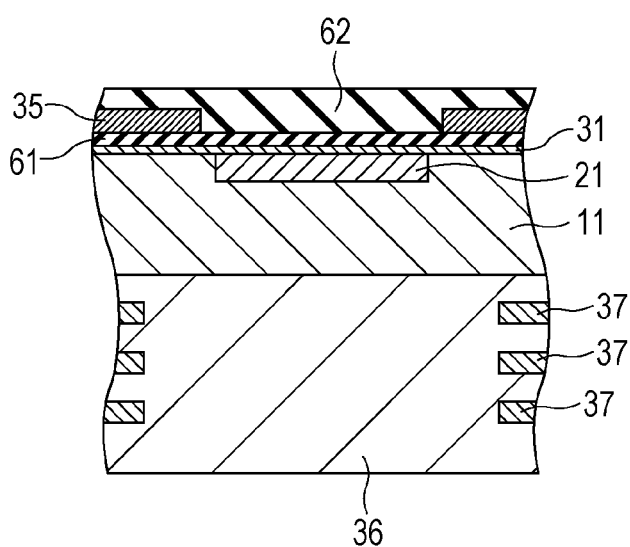

Subsequently, a SiO$_2$ second insulating layer 62 is formed over the entire surface by CVD and is then planarized, differing from Step 430 of the method of the fourth embodiment. Thus the light-shielding layer 35 is embedded in the second insulating layer 62, as shown in FIG. 9B.

Step 540

Figure 10A:
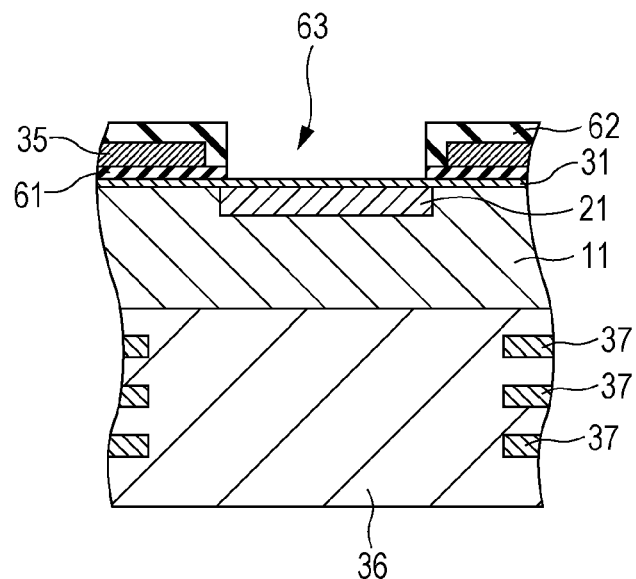
FIGS. 10A and 10B are schematic fragmentary sectional views subsequent to FIG. 9B, showing the method for manufacturing the solid-state imaging element according to the fifth embodiment.

Then, the second insulating layer 62 and the first insulating layer 61 are dry-etched using an etching mask formed on the second insulating layer 62 by photolithography so that the second insulating layer 62 remains on the top and side surface of the light-shielding layer 35, as shown in FIG. 10A. Thus, a space 63 surrounded by the second insulating layer 62 and the first insulating layer 61 is formed over the light-receiving element portion 21.

Step 550

Figure 10B:
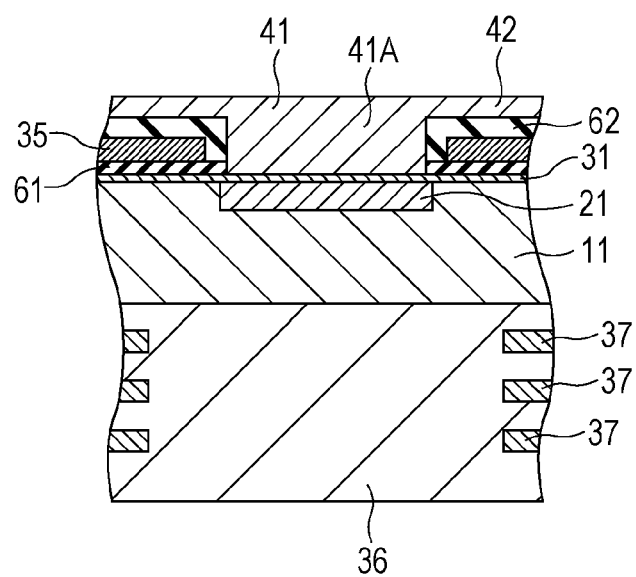

Subsequently, a dielectric material layer 41A is formed over the entire surface to form the antenna structure 41 in the space 63 as shown in FIG. 10B in the same manner as in Step 450 of the fourth embodiment. A dielectric material layer for the antenna structure 41 may be formed over the entire surface by CVD, as in the first embodiment. The antenna structure 41 may or may not be patterned. If the antenna structure 41 is not patterned, an extension 42 extends from the antenna structure 41.

Step 560

Then, a SiO$_2$ insulating interlayer is formed over the entire surface by CVD, and is then planarized. Thus, the insulating layer (first insulating layer 61 and second insulating layer 62) is formed in such a manner as to surround the antenna structure 41, and the insulating interlayer is formed over the antenna structure 41 and the insulating layer (second insulating layer 62). Then, a color filter 33 and a microlens 34 are formed on the insulating interlayer by a known method. Thus, a solid-state imaging element according to the fifth embodiment is completed.

In the method of the first embodiment, when the dielectric material layer is patterned into the antenna structure 41 by etching in Step 120, the semiconductor layer and other members may be damaged, and consequently, the dark current, which is an output of noises during not receiving light, may be increased. On the other hand, for forming the antenna structure in the fifth embodiment, merely an opening is formed in the portions of the second insulating layer 62 and the first insulating layer 61 over the light-receiving element portion 21 in Step 540. Thus, the region that can be damaged is limited to the light-receiving element portion, and consequently the dark current can be reduced. Accordingly, the manufacturing process of the solid-state imaging element can be flexibly designed.

Sixth Embodiment

Figure 11A:
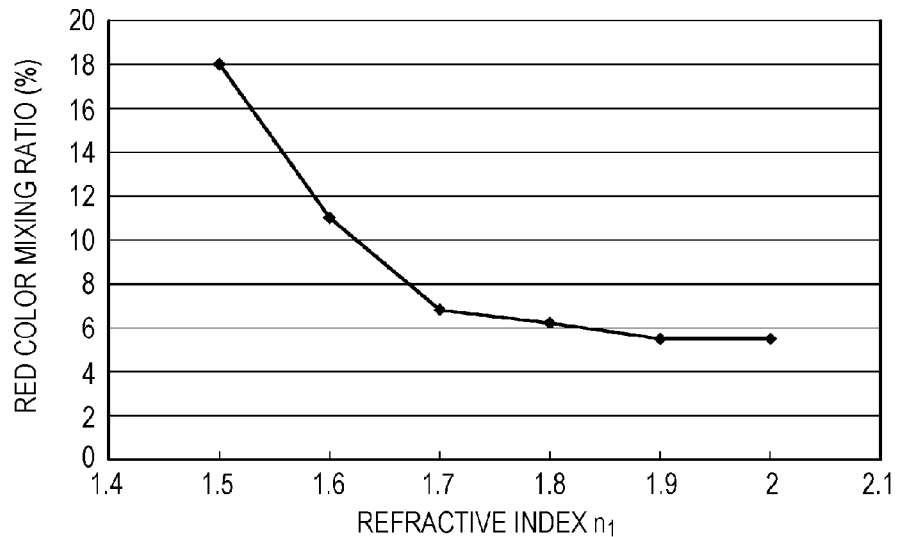
FIG. 11A is a plot of the results of measurements for the red color mixing ratio of solid-state imaging elements according to a sixth embodiment including antenna structures made of materials having different refractive indexes.

In a sixth embodiment, the solid-state imaging element of the first embodiment is modified. For the solid-state imaging element of the sixth embodiment, red color mixing ratios were measured of solid-state imaging elements including antenna structures 41 made of materials having different refractive indexes $n_1$. The results are shown in FIG. 11A. The insulating layer 32 was made of SiO$_2$. The antenna structure 41 had a diameter $R_1$ of 0.3 μm and a height $H_1$ of 0.2 μm. FIG. 11A shows that when the antenna structure 41 had a refractive index $n_1$ of 1.7 or more and the value of $(n_1-n_0)$ was 0.25 or more, the red color mixing ratio was stable and low. Exemplary materials having a refractive index $n_1$ of 1.7 or more include silicon nitride (SiN), silicon oxynitride (SiON), hafnium oxide (HfO$_x$), tantalum oxide (Ta$_2$O$_5$), and transparent dielectric materials in which fine particles are dispersed (for example, siloxane in which TiO$_x$ fine particles are dispersed).

Seventh Embodiment

Figure 11B:
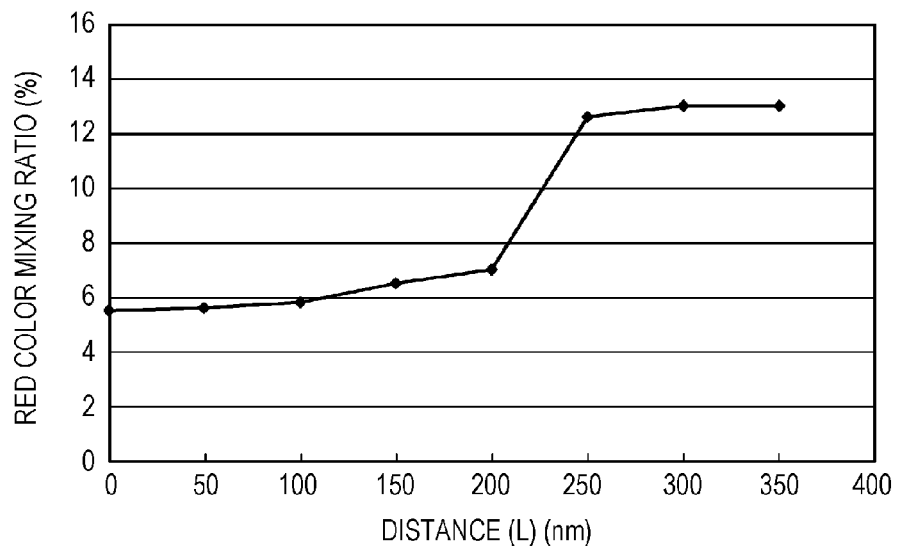
FIG. 11B is a plot similar to FIG. 11A of solid-state imaging elements according to a seventh embodiment in which the distance between the surface of the semiconductor layer and the bottom of the antenna structure is varied.

In a seventh embodiment, the solid-state imaging element of the first embodiment is modified. For the solid-state imaging element of the seventh embodiment, red color mixing ratios were measured of solid-state imaging elements in which the distance L between the surface of the semiconductor layer 11 and the bottom of the antenna structure 41 was varied. The results are shown in FIG. 11B. The antenna structure 41 had a diameter $R_1$ of 0.3 μm and a height $H_1$ of 0.2 μm. The horizontal axis of FIG. 11B represents the distance L between the surface of the semiconductor layer 11 and the bottom of the antenna structure 41. FIG. 11B shows that a preferred distance L between the surface of the semiconductor layer 11 and the bottom of the antenna structure 41 is 0.2 μm or less. When incident light has a wavelength λ of 540 nm, the wavelength of light in the antenna structure 41 is $\lambda/n_1=540/1.9=284$ (nm), and a preferred distance L is approximately lower than or equal to $\lambda/n_1$.

FIGS. 12A to 12D show the simulation results of light energy propagation in the solid-state imaging elements used in the above measurement when light having a wavelength of 540 nm enters the microlens 34 and passes through the color filter 33, the insulating layer 32 and the antenna structure 41. FIG. 12A shows the results when the distance L is 0 nm; FIG. 12B shows the results when the distance L is 50 nm; FIG. 12C shows the results when the distance L is 100 nm; and FIG. 12D shows the results when the distance L is 200 nm.

FIGS. 12A to 12D show that as the distance L is increased, light is diffused and is, accordingly, less concentrated in the center of the light-receiving element portion 21.

Eight Embodiment

Figure 13A:
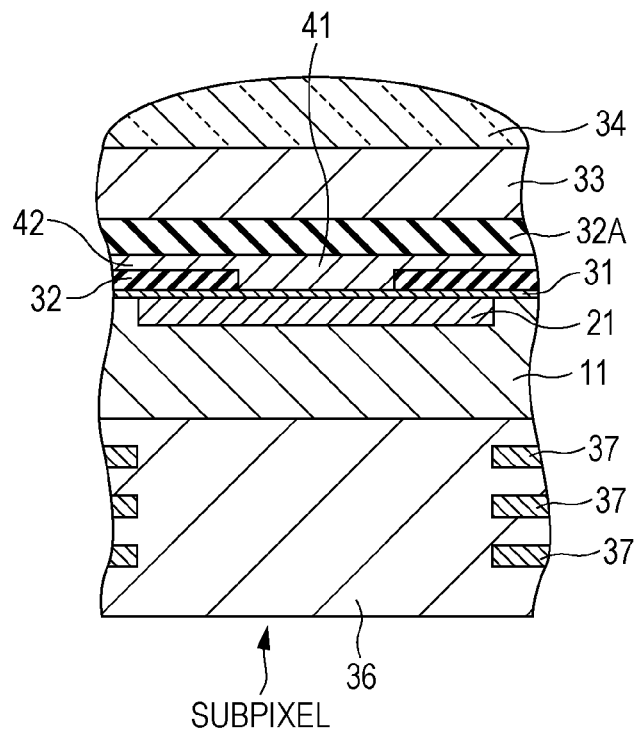
FIG. 13A is a schematic fragmentary sectional view of a solid-state imaging element according to an eighth embodiment of the present invention.
Figure 13B:
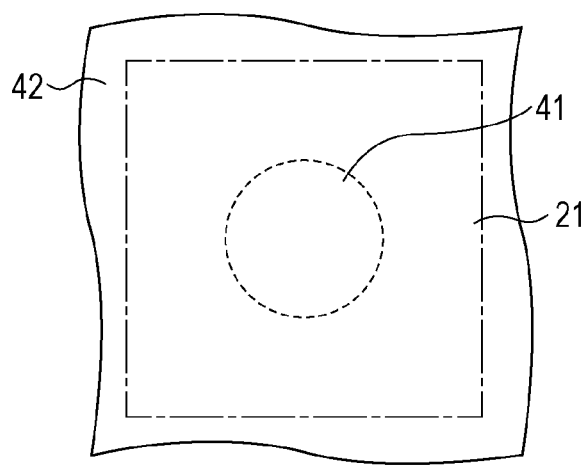
FIG. 13B is a schematic view of the positional relationship between the top of the antenna structure and an extension of the antenna structure.

In an eighth embodiment, the solid-state imaging element of the first embodiment is modified. FIG. 13A is a schematic fragmentary sectional view of a solid-state imaging element according to the eighth embodiment, and FIG. 13B is a schematic view of the positional relationship between the top of the antenna structure and an extension of the antenna structure. As shown in FIGS. 13A and 13B, the antenna structure 41 of the solid-state imaging element of the eighth embodiment has an extension 42 extending from the top thereof in parallel with the surface of the semiconductor layer 11. In FIG. 13B, the position where the antenna structure 41 is disposed is indicated by the dotted line, and the position where the light-receiving element portion 21 is disposed is indicated by the dotted chain line.

A method for manufacturing the solid-state imaging element of the eighth embodiment will now be described.

Step 800

First, a drive circuit, a peripheral circuit, a planarizing layer 36, wirings 37 and so forth are formed, and further a light-receiving element portion 21 was formed, in the same manner as in Step 100 of the first embodiment. Subsequently, an antireflection film 31 is formed on the rear side of the silicon semiconductor substrate (surface of the semiconductor layer 11) by sputtering, in the same manner as in Step 110 of the first embodiment.

Step 810

Then, an insulating layer 32 is formed to a thickness of 0.2 μm over the entire surface by CVD. An opening in which the antenna structure is to be formed is formed in the portion of the insulating layer 32 over the light-receiving element portion 21 by lithography and etching.

Step 820

Subsequently, a dielectric material layer for the antenna structure 41 is formed on the insulating layer 32 and in the opening by CVD. By forming the dielectric material layer for the antenna structure 41, a disc-like antenna structure 41 is formed in the opening in the insulating layer 32. At the same time, an extension 42 can be formed which extends from the top of the antenna structure 41.

Step 830

Subsequently, an insulating interlayer 32A is formed over the entire surface, and a color filter 33 and a microlens 34 are formed on the insulating interlayer 32A by a known method. Thus a solid-state imaging element of the eighth embodiment is completed.

In the method of the first embodiment, when the dielectric material layer is patterned into the antenna structure 41 by etching in step 120, the semiconductor layer and other members may be damaged, and consequently, the dark current, which is an output of noises during not receiving light, may be increased. On the other hand, for forming the antenna structure in the eighth embodiment, merely an opening is formed in the portion of the insulating layer 32 over the light-receiving element portion 21 in Step 810 by etching. Thus, the region that can be damaged is limited to the light-receiving element portion, and consequently the dark current can be reduced. Accordingly, the manufacturing process of the solid-state imaging element can be flexibly designed.

Figure 14:
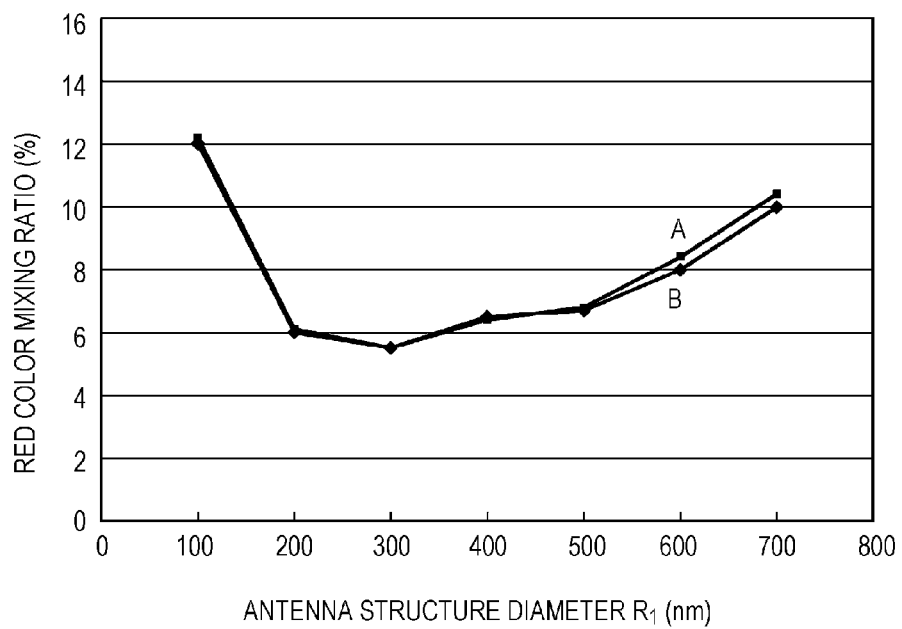
FIG. 14 is a plot of the results of measurements for red color mixing ratio in a solid-state imaging device according to the eighth embodiment.

For the solid-state imaging element of the eighth embodiment, color mixing ratios were measured of samples, each including an antenna structure 41 having a diameter $R_1$ of 0.3 μm and a height $H_1$ of 0.2 μm as in the first embodiment. The results are shown in FIG. 14. The red color mixing ratio of the solid-state imaging element having the same structure as the first embodiment is also shown together in FIG. 14. In FIG. 14, data A indicated by black squares represents the results of the solid-state imaging element of the eighth embodiment, and data B indicated by black rhombuses represents the results of the solid-state imaging element having the same structure as the first embodiment. FIG. 14 shows that the red color mixing ratio in the eighth embodiment is not substantially changed in comparison with that in the first embodiment.

The solid-state imaging element of the eighth embodiment may be provided with the light-shielding layer described in the third to the fifth embodiment.

Although the present invention has been described with reference to preferred embodiments, the invention is not limited to the disclosed embodiments. The structure of the solid-state imaging element and the method for manufacturing the solid-state imaging element, and the materials used can be appropriately changed. Although the above embodiments describe rear emission solid-state imaging elements, the solid-state imaging element may be of front emission type. Although in the above embodiments, CMOS image sensors have been described as examples of the soli-state imaging element of the invention, the invention can be applied to any type of solid-state imaging device, such as CCD image sensors. Also, the solid-state imaging element can be applied to optical components having a light-receiving element portion, such as photodiodes.

The present application contains subject matter related to that disclosed in Japanese Priority Patent Application JP 2009-281313 filed in the Japan Patent Office on Dec. 11, 2009, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging element comprising:
    a light-receiving element portion disposed in a semiconductor layer;
    an insulating layer made of a material having a first refractive index, disposed over the semiconductor layer;
    a microlens formed over the insulating layer; and
    an antenna structure disposed over the light-receiving element portion and surrounded by the insulating layer, the antenna structure being made of a material having a second refractive index that is higher than the first refractive index of the insulating layer,
    wherein the antenna structure has an area that is less than an area of the light receiving element portion, and
    wherein the energy of light having entered the antenna structure and the insulating layer is concentrated in the light-receiving element portion.

2. The solid-state imaging element according to claim 1, wherein the antenna structure has a cylindrical shape having a diameter of 0.2 to 0.4 μm.

3. The solid-state imaging element according to claim 1, further comprising:
- an insulating interlayer over the antenna structure and the insulating layer,
- a color filter on the insulating interlayer, wherein the microlens is formed on the color filter.

4. The solid-state imaging element according to claim 1, wherein the antenna structure has an extension extending from the top thereof in a direction parallel to the surface of the semiconductor layer.

5. The solid-state imaging element according to claim 1, wherein the first refractive ($n_0$) and the second refractive index ($n_1$) satisfy the relationship $(n_1-n_0) \geq 0.25$.

6. The solid-state imaging element according to claim 1, wherein the antenna structure has a flat top.

7. The solid-state imaging element according to claim 1, wherein the antenna structure is disposed with a distance of 0.2 μm or less between the bottom thereof and the surface of the semiconductor layer.

8. The solid-state imaging element according to claim 1, further comprising an antireflection film on the surface of the semiconductor layer, wherein a first surface of the antireflection film is in contact with the surface of the semiconductor layer, and wherein a second surface of the antireflection film is in contact with a surface of the antenna structure.

9. The solid-state imaging element according to claim 1, further comprising a light-shielding layer around the antenna structure with the insulating layer therebetween.

10. The solid-state imaging element according to claim 1, further comprising a drive circuit driving the light-receiving element portion on a side of the semiconductor layer opposite to the antenna structure.

11. The solid-state imaging element according to claim 5, wherein the material of the antenna structure includes at least one selected from the group consisting of silicon nitride, silicon oxynitride, hafnium oxide, and tantalum oxide.

12. The solid-state imaging element according to claim 5, wherein the material of the antenna structure includes a transparent dielectric material in which fine particles are dispersed.

* * * * *